(12) United States Patent
Hu et al.

(10) Patent No.: US 11,538,873 B2
(45) Date of Patent: Dec. 27, 2022

(54) DISPLAY SCREEN AND ELECTRONIC EQUIPMENT INCLUDING THE SAME

(71) Applicant: BEIJING XIAOMI MOBILE SOFTWARE CO., LTD., Beijing (CN)

(72) Inventors: Xiankun Hu, Beijing (CN); Zhongsheng Jiang, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 16/671,891

(22) Filed: Nov. 1, 2019

(65) Prior Publication Data
US 2020/0168676 A1 May 28, 2020

(30) Foreign Application Priority Data

Nov. 27, 2018 (CN) .......................... 201811426461.X

(51) Int. Cl.
*H01L 27/32* (2006.01)
*H01L 51/50* (2006.01)

(52) U.S. Cl.
CPC .......... *H01L 27/3234* (2013.01); *H01L 51/50* (2013.01); *H01L 2251/5338* (2013.01)

(58) Field of Classification Search
None
See application file for complete search history.

(56) References Cited

U.S. PATENT DOCUMENTS

| | | | | |
|---|---|---|---|---|
| 3,983,298 A * | 9/1976 | Hahn | ......................... | C09J 7/38 428/447 |
| 4,223,067 A * | 9/1980 | Levens | ...................... | C09J 7/38 428/338 |
| 5,089,071 A * | 2/1992 | Tominaga | ......... | C04B 35/63408 156/89.19 |
| 9,631,126 B2 * | 4/2017 | Lee | ...................... | H05K 1/0274 |
| 10,489,629 B1 | 11/2019 | Jiang et al. | | |
| 2013/0044282 A1 * | 2/2013 | Kuwabara | ............. | G02F 1/1333 349/96 |
| 2014/0370307 A1 * | 12/2014 | Hao | ..................... | G02B 5/0294 428/447 |
| 2015/0357375 A1 | 12/2015 | Tsai et al. | | |

(Continued)

FOREIGN PATENT DOCUMENTS

CN 106897709 A 6/2017
CN 107193412 A 9/2017

(Continued)

OTHER PUBLICATIONS

JP-2008111030-A machine translation (Year: 2022).*

(Continued)

*Primary Examiner* — Vincent Wall
(74) *Attorney, Agent, or Firm* — Arch & Lake LLP

(57) ABSTRACT

A display screen and an electronic equipment are provided. The display screen comprises a middle frame, a display panel and an optical fingerprint sensor. The display panel is superimposed on the upper surface of the middle frame, and the through-hole provided on the middle frame and extending through the upper and lower surfaces of the middle frame is filled with a transparent body, the optical fingerprint sensor is disposed beneath the transparent body.

14 Claims, 2 Drawing Sheets

(56) References Cited

U.S. PATENT DOCUMENTS

| | | | |
|---|---|---|---|
| 2016/0187708 A1* | 6/2016 | Zhang | G02F 1/133528 |
| | | | 349/43 |
| 2016/0200949 A1 | 7/2016 | Lee et al. | |
| 2017/0098110 A1 | 4/2017 | Kim et al. | |
| 2018/0151641 A1* | 5/2018 | Choo | G06F 1/1643 |
| 2018/0233702 A1 | 8/2018 | Chen | |
| 2018/0293420 A1* | 10/2018 | Kim | H04M 1/0266 |
| 2018/0315803 A1* | 11/2018 | Jin | G06K 9/0004 |
| 2018/0365472 A1 | 12/2018 | Cai | |

FOREIGN PATENT DOCUMENTS

| | | | | |
|---|---|---|---|---|
| CN | 107329303 A | | 11/2017 | |
| CN | 107563306 A | | 1/2018 | |
| CN | 108323207 A | | 7/2018 | |
| CN | 207780668 U | | 8/2018 | |
| CN | 207924638 U | | 9/2018 | |
| CN | 108647558 A | | 10/2018 | |
| JP | 2008111030 A | * | 5/2008 | |
| JP | 2016023225 A | * | 2/2016 | |
| TW | I636306 B | | 9/2018 | |
| WO | WO-2015195616 A1 | * | 12/2015 | C09J 7/22 |
| WO | WO-2018101461 A1 | * | 6/2018 | C09J 133/14 |
| WO | 2018196149 A1 | | 11/2018 | |

OTHER PUBLICATIONS

Extended European Search Report issued to European Application No. 19211219.1 dated Jan. 20, 2020, (8p).

First Office Action issued to Chinese Application No. 201811426461.X dated May 7, 2021 with English translation, (18p).

First Office Action issued to European Application No. 19211219.1 dated Jul. 8, 2021, (3p).

Second Office Action issued to Chinese Application No. 201811426461.X dated Mar. 3, 2022 with English translation, (18p).

Second Office Action issued to EP Application No. 19211219.1 dated Jun. 29, 2022, (3p).

* cited by examiner

DISPLAY SCREEN AND ELECTRONIC EQUIPMENT INCLUDING THE SAME

CROSS REFERENCE

This application is based upon and claims priority to Chinese Patent Application No. 201811426461.X, filed on Nov. 27, 2018, which is incorporated herein by reference in its entirety.

TECHNICAL FIELD

The present disclosure relates to the technology field of electronic equipment, and in particular, to a display screen and an electronic equipment.

BACKGROUND

In the related art, a fingerprint sensor is configured beneath a mobile phone display panel, and a glass cover-plate is disposed, as a packaging material, to the surface of the display panel. When performing a fingerprint identification, the glass cover-plate can serve to prevent deformation of the display panel, so as to protect the fingerprint sensor beneath a display screen from being damaged. However, in the case that the packaging material for the surface of the display panel is a flexible material, the display panel will deform under a pressure, so that if a user presses his/her finger on the display screen, or if a reliability test (such as a ball drop test) is performed to the display screen, an area of the display screen corresponding to the fingerprint sensor under the screen will collapse, which in turn will cause oppression and damage on the fingerprint sensor beneath the screen.

SUMMARY

The present disclosure seeks to remedy these drawbacks of the prior art by providing a display screen and an electronic equipment.

According to a first aspect of the disclosure, a display screen is provided, the display screen comprises a middle frame, a display panel and an optical fingerprint sensor. The display panel is superimposed on the upper surface of the middle frame, and the display panel is light-transmissible. The middle frame is provided with a through-hole extending through the upper and lower surfaces of the middle frame. The through-hole is filled with a transparent body, and the optical fingerprint sensor is disposed beneath the transparent body.

According to a second aspect of the disclosure, an electronic equipment is provided, the electronic equipment comprises an aforementioned display screen.

It should be understood that the above general description and the following detailed description are merely exemplary and explanatory and are not intended to limit the present disclosure.

BRIEF DESCRIPTION OF THE DRAWINGS

The accompanying drawings are incorporated in and constitute part of the specification, show the embodiments of the present disclosure and are intended to explain the principle of the present disclosure together with the description.

DETAILED DESCRIPTION

Exemplary embodiments will now be described more detailed with reference to the accompanying drawings in which the embodiments are illustrated. Once the following description involves the drawings, unless otherwise provided, the same numbers in different drawings denote the same or similar elements. Those implementations described in the exemplary embodiments hereinafter may not represent all the implementations in correspondence with the disclosure. Instead, they are merely examples of apparatus and methods in correspondence with some aspects of the disclosure, as specified in the appended claims.

The technical solution provided by the embodiments of this disclosure can involve the following advantageous effects: according to the disclosure, the display panel is superimposed on the upper surface of the middle frame, the through-hole provided on the middle frame and extending through the upper and lower surfaces of the middle frame is filled with a transparent body, and the optical fingerprint sensor is disposed beneath the transparent body. Because the transparent body can effectively prevent the deformation in the display panel and thus can provide both support and protection for the optical fingerprint sensor disposed beneath the transparent body, and also because the display panel and the transparent body are both light-transmittable, the optical fingerprint sensor can get the incoming light passed through the display panel and transparent body, and thereby achieve the function of optical fingerprint identification. Accordingly, the disclosure not only can achieve the function of optical fingerprint identification under the screen, without providing any hole in the display screen, but also can effectively guarantee the reliability of the optical fingerprint sensor.

Figure 1:
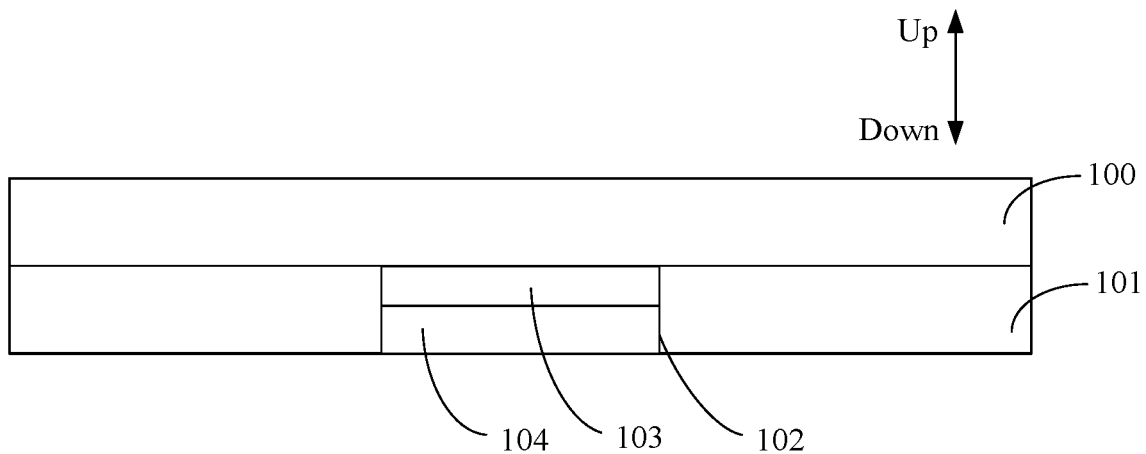
FIG. 1 is a cross section illustrating a display screen according to an example.

FIG. 1 is a cross section illustrating a display screen according to an example. As shown in FIG. 1, the display screen may comprise a middle frame 101, a display panel 100 and an optical fingerprint sensor 104. The display panel 100 is superimposed on the upper surface of the middle frame 101, and the display panel 100 is light-transmissible. The middle frame 101 has a through-hole 102 extending through the upper and lower surfaces of the middle frame 101, the through-hole 102 is filled with a transparent body 103.

The optical fingerprint sensor 104 is provided beneath the transparent body 103.

In the present disclosure, the middle frame may be indicated as a frame for supporting the display panel. The transparent body may be indicated as an object with high transmittance (for example, a transmittance over 80%), in which the transmittance may be indicated as a ratio of the radiation energy projected on and passed through an object to the total radiation energy projected on the object, during a course of which an incident light flux incomes from an illuminated plane or an incident plane of the object to the other plane and exits.

The display panel of the disclosure can implement the function of image display and the display panel is light-transmissible. The display panel may include a LED (Light Emitting Diode) display or an OLED (Organic Light-Emitting Diode) display, as long as the display panel is light-transmissible. The type of the display panel is not limited in the disclosure.

According to the light reflected by the object to be measured and caught by the fingerprint sensor, the optical fingerprint sensor of the disclosure can create an image to be identified, and then can perform a fingerprint identification according to the image so as to get a result of fingerprint identification; or else, the optical fingerprint sensor can send the created image to be identified to a terminal device that is communicated with the optical fingerprint sensor, and then the terminal device perform a fingerprint identification according to the image to be identified, so as to get the result of fingerprint identification.

As an example of the present embodiment, the display panel 100 can be pasted to an upper surface of the middle frame 101, and the middle frame 101 may have a through-hole 102 extending through the upper and lower surfaces of the middle frame 101. The through-hole 102 is filled with a transparent body 103 (for example, if the transparent body 103 is made of glass, then a columnar glass having a shape fitting to the through-hole 102 can be pasted into the through-hole 102). And, an optical fingerprint sensor 104 can be provided below the transparent body 103, with the light-emitting and light-receiving elements in the optical fingerprint sensor 104 directly facing the transparent body 103, so that the light from the optical fingerprint sensor 104 can be emitted outward through the transparent body 103 and the display panel 100, and the optical fingerprint sensor 104 can create an image to be identified according to the incident light passed through the display panel 100 and the transparent body 103.

According to the disclosure, the display panel is super-imposed on the upper surface of the middle frame, and the through-hole, which is provided in the middle frame and extending through the upper and lower surfaces of the middle frame, is filled with a transparent body, the optical fingerprint sensor is provided below the transparent body. Because the transparent body can effectively prevent the deformation in the display panel and thus can provide both support and protection for the optical fingerprint sensor disposed beneath the transparent body, and also because the display panel and the transparent body are both light-transmittable, the optical fingerprint sensor can get the incoming light passed through the display panel and transparent body, and thereby achieve the function of optical fingerprint identification. Accordingly, the disclosure not only can achieve the function of optical fingerprint identification under the screen, without providing any hole in the display screen, but also can effectively guarantee the reliability of the optical fingerprint sensor.

In a possible implementation, a liquid transparent body can be injected into the through-hole, and the liquid transparent body can be processed to form a solid transparent body. The disclosure does not limit both the material of the transparent body and the way by which the transparent body is filled within the through-hole.

As an example of the present embodiment, the optical fingerprint sensor can emit light outward through the transparent body and the display panel, and can receive incident light passed through the transparent body and the display panel.

For instance, when the optical fingerprint sensor performs a fingerprint identification, a light can be emitted towards the transparent body and the display panel. The light can be emitted and propagate outward through the transparent body and the display panel, when the light emitted outward meets an object to be measured (for example, the user's finger), some of the light will be reflected back by the object to be measured, and the reflected light may propagate through the display panel and the transparent body towards the optical fingerprint sensor, and the optical fingerprint sensor can create an image to be identified according to the reflected light received by the optical fingerprint sensor, and then determine a result of fingerprint identification according to the image to be identified.

In a possible implementation, the through-hole may be provided at any position on the symmetrical axis of the middle frame. Since the symmetrical axis is at a distance from either side of the middle frame, which can facility a user to press his/her fingerprint at a position corresponding to the through-hole on the display screen, to prevent the user's finger from deviating the display screen area, and thereby, promote the optical fingerprint sensor to acquire the whole fingerprint image. For example, the through-hole can be provided at the center of the middle frame. The through-hold overlaps at least partially with the longitudinal or transverse symmetrical axis of the middle frame close to either end of the middle frame.

In a possible implementation, the through-hole can also be provided at other positions of the middle frame. For example, if the middle frame is of a rectangular configuration, the through-hole can be provided near any one of the four corners of the middle frame. It should be noted that the through-hole may be provided at any position of the middle frame as needed, and the position of the through-hole at the middle frame would not be limited in the disclosure.

As an example of the present embodiment, the transparent body can be made of hard material. As such, the deformation from the display panel can be blocked more effectively by the transparent body, and thereby the optical fingerprint sensor beneath the transparent body can be supported and protected more effectively.

In a possible implementation, the material of the transparent body comprises any one of glass, ceramic and plastic. It should be noted that other material with high transmittance may also be selected for the transparent body as needed, and the material of the transparent body would not be limited in the disclosure.

As an example of the present embodiment, as shown in FIG. 1, the optical fingerprint sensor 104 can be disposed in the through-hole 102.

For instance, the middle frame 101 may have a thickness larger than that of the optical fingerprint sensor 104. The display panel 100 can be pasted to the upper surface of the middle frame 101, and the through-hole 102 in the middle frame 101 may be provided to have a cross-section fitting to that of the optical fingerprint sensor 104, with the through-hole 102 extending through the upper and lower surfaces of the middle frame 101. The transparent body 103 may be processed in accordance with the shape of the gap between the optical fingerprint sensor 104 and the display panel 100, so that the transparent body 103 embedded within the through-hole 102 can well fill the gap between the optical fingerprint sensor 104 and the display panel 100, that is, when the transparent body 103 and the optical fingerprint sensor 104 are embedded into the through-hole 102, the lower surface of the optical fingerprint sensor 104 and the lower surface of the middle frame 101 are substantially flush. Next, the processed transparent body 103 may be embedded into the through-hole 102 and the optical fingerprint sensor 104 may be embedded beneath the transparent body 103 in the through-hole 102, and that the light-emitting and light-receiving elements in the optical fingerprint sensor 104 are provided to directly face the transparent body 103, such that the lower surface of the optical fingerprint sensor 104 and the lower surface of the middle frame 101 are substantially flush.

Accordingly, the disclosure not only can achieve the function of optical fingerprint identification beneath the screen, without providing any hole in the display screen, but also can effectively guarantee the reliability of the optical fingerprint sensor. Also, the thickness of the display screen can be decreased effectively.

Figure 2:
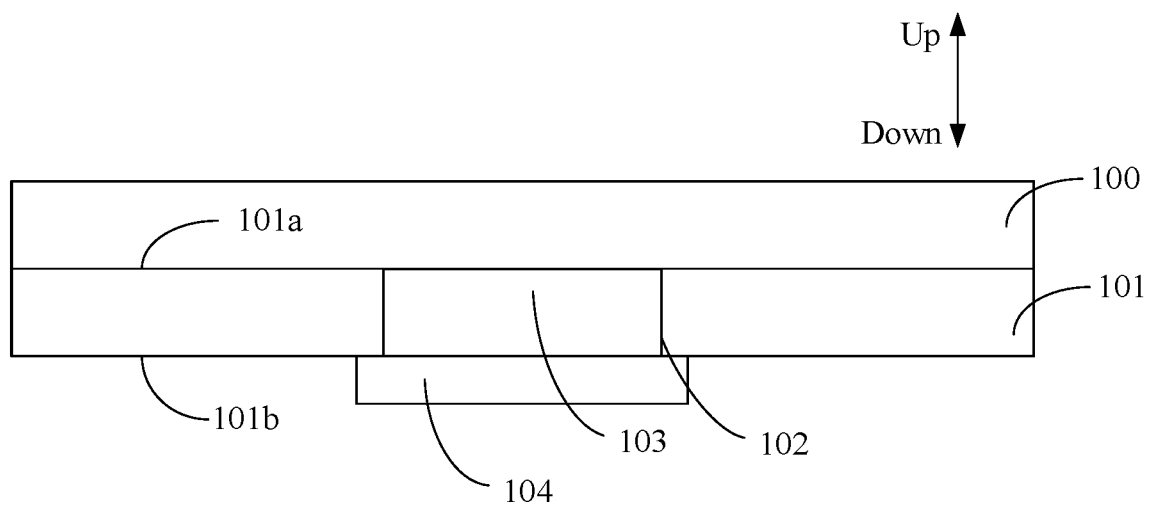
FIG. 2 is a cross section illustrating a display screen according to an example.

FIG. 2 is a cross section illustrating a display screen according to an example. As shown in FIG. 2, the optical fingerprint sensor 104 may be disposed outside the through-hole 102 and close to the lower surface of the middle frame 101. For example, the optical fingerprint sensor 104 may be disposed at least partially on the lower surface 101b of the middle frame 101.

For instance, the middle frame 101 can be provided with a through-hole 102, the through-hole 102 extends through an upper surface 101a and a lower surface 101b of the middle frame 101. The display panel 100 can be pasted to the upper surface 101a of the middle frame 101. The transparent body 103 can be processed in accordance with the shape of the through-hole 102, the transparent body 103 can be embedded into the through-hole 102 such that the transparent body 103 can well fill the entire through-hole 102, and then the optical fingerprint sensor 104 can be pasted to the lower surfaces of both the middle frame 101 and the transparent body 103, and that the light-emitting and light-receiving elements in the optical fingerprint sensor 104 are provided to directly face the transparent body 103.

As an example of the present embodiment, the display panel can be a flexible display panel. The flexible display panel can be made from a flexible material (for example, the flexible material can be a phosphorescent organic light emitting device (PHOLED). In general, the flexible display panel may be a deformable and bendable display device. In this way, the disclosure not only can achieve the function of optical fingerprint identification beneath a flexible, folding display screen, without providing any hole in the display screen, but also can effectively guarantee the reliability of the optical fingerprint sensor beneath a flexible, folding display screen.

Figure 3:
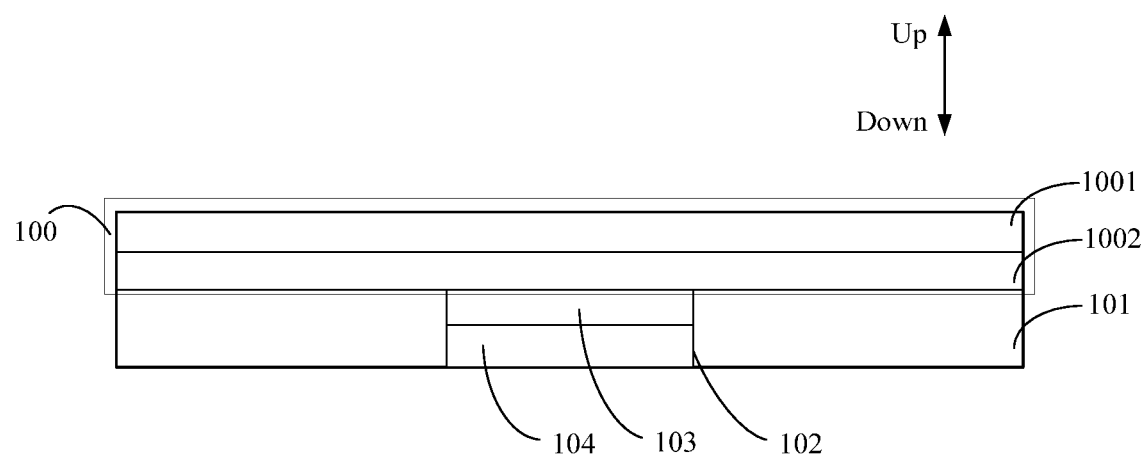
FIG. 3 is a cross section illustrating a display screen according to an example.

FIG. 3 is a cross section illustrating a display screen according to an example. As shown in FIG. 3, the display panel 100 may comprise an organic light emitting diode display 1002 and a flexible packaging layer 1001, the flexible packaging layer 1001 is superimposed on the organic light emitting diodes display 1002. For example, the material of the flexible packaging layer 1001 may comprise a polyimide (PI) membrane, which has good performance in electrical insulation and exhibits outstanding resistance to radiation, high temperature, and chemical corrosion. The PI membrane can be pasted on the organic light emitting diode display 1002 to form a packaging layer, so as to provide protection for the organic light emitting diode display 1002. The material of the transparent body 103 may include glass, ceramics, rigid plastics or other solid, hard material with high transmittance. In this way, the transparent body 103 supports the flexible display panel 100, and effectively avoids the optical fingerprint sensor 104 from being damaged due to deformation as being squeezed by the flexible display panel 100. Meanwhile, the display panel 100 and the transparent body 103 are light-transmissible, so that the function of optical identification of the optical fingerprint sensor 104 beneath a flexible, folding display screen can be achieved, without providing any hole in the display screen, also without affecting the display effect in the corresponding area of the through-hole 102, and also improve the mechanical strength and closure performance of the display screen.

In a possible implementation, an electronic equipment is provided, the electronic equipment may comprise an aforementioned display screen. The electronic equipment may be, for example, a mobile phone, a tablet computer, a smartwatch, a notebook computer or other electronic equipment, which is not limited hereby. For instance, in the electronic equipment the display panel is light-transmissible. The middle frame beneath the display panel may be provided with a through-hole extending through the upper and lower surfaces of the middle frame, the through-hole is filled with a transparent body, and an optical fingerprint sensor may be disposed beneath the transparent body. The optical fingerprint sensor can emit light outward through the transparent body and the display panel, and can receive an incoming light passed through the transparent body and the display panel. An image to be identified can be formed according to the incoming light, and the electronic equipment can perform a fingerprint identification according to the image to be identified.

In a possible implementation, the optical fingerprint sensor can emit light outward through the transparent body and the display panel, and can receive incident light passed through the transparent body and the display panel.

In a possible implementation, the transparent body is made of hard material.

In a possible implementation, the optical fingerprint sensor is disposed in the through-hole.

In a possible implementation, the optical fingerprint sensor is disposed outside the through-hole and close to the lower surface of the middle frame.

In a possible implementation, the display panel is a flexible display panel.

In a possible implementation, the display panel comprise an organic light emitting diode (OLED) display and a flexible packaging layer, and the flexible packaging layer is superimposed on the OLED display.

In a possible implementation, the through-hole overlaps at least partially with the symmetrical axis of the middle frame.

In a possible implementation, the material of the transparent body includes any one of glass, ceramic and plastic.

In accordance with the disclosure, the display panel is superimposed on the upper surface of the middle frame, the through-hole provided on the middle frame and extending through the upper and lower surfaces of the middle frame is filled with a transparent body, and the optical fingerprint sensor is disposed beneath the transparent body. Because the transparent body can effectively prevent the deformation in the display panel and thus can provide both support and protection for the optical fingerprint sensor disposed beneath the transparent body, and also because the display panel and the transparent body are both light-transmittable, the optical fingerprint sensor can get the incoming light passed through the display panel and transparent body, and thereby achieve the function of optical fingerprint identification. Accordingly, the present disclosure not only can achieve the function of optical fingerprint identification beneath the screen, without providing any hole in the display screen, but also can effectively ensure the reliability of the optical fingerprint sensor.

It should be understood that the present disclosure is not intended to be limited to the precise structures that have been as above-mentioned and illustrated in the drawings, and various of modifications and variations can be made without deviating from the scope thereof. The scope of the disclosure is merely defined by the attached claims.

What is claimed is:

1. A display screen, comprising:
   a middle frame comprising an upper surface and a lower surface, wherein the middle frame is provided with a through-hole extending through the upper and lower surfaces of the middle frame;
   a display panel disposed above and in direct contact with the upper surface of the middle frame, wherein the display panel is light-transmissible;
   an optical fingerprint sensor disposed at least partially below the through-hole,
   wherein the through-hole is filled with a transparent body, wherein the material of the transparent body is glass or ceramic, to prevent a deformation in the display panel and to support and protect the optical fingerprint sensor,
   wherein the display panel comprises an organic light emitting diode display and a flexible packaging layer, the flexible packaging layer is superimposed above the organic light emitting diode display, the flexible packaging layer is in physical contact with the organic light emitting diode display.

2. The display screen according to claim 1, wherein the optical fingerprint sensor can emit light outward through the transparent body and the display panel, and can receive incident light passed through the transparent body and the display panel.

3. The display screen according to claim 1, wherein the optical fingerprint sensor is disposed in the through-hole.

4. The display screen according to claim 1, wherein the optical fingerprint sensor is disposed outside the through-hole and close to the lower surface of the middle frame.

5. The display screen according to claim 1, wherein the display panel is a flexible display panel.

6. The display screen according to claim 1, wherein the through-hole overlaps at least partially with a symmetrical axis of the middle frame.

7. An electronic equipment, comprising:
   a display screen that comprises a middle frame, a display panel disposed above and in direct contact with an upper surface of the middle frame, and an optical fingerprint sensor,
   wherein the middle frame is provided with a through-hole extending through the upper and lower surfaces of the middle frame;
   wherein the display panel is light-transmissible;
   wherein the optical fingerprint sensor is disposed at least partially below the through-hole;
   wherein the through-hole is filled at least partially with a transparent body, wherein the material of the transparent body is glass or ceramic, to prevent a deformation in the display panel and to support and protect the optical fingerprint sensor,
   wherein the display panel comprises an organic light emitting diode display and a flexible packaging layer, the flexible packaging layer is superimposed above the organic light emitting diode display, the flexible packaging layer is in physical contact with the organic light emitting diode display.

8. The electronic equipment according to claim 7, wherein the optical fingerprint sensor can emit light outward through the transparent body and the display panel, and can receive incident light passed through the transparent body and the display panel.

9. The electronic equipment according to claim 7, wherein the optical fingerprint sensor is disposed in the through-hole.

10. The electronic equipment according to claim 7, wherein the optical fingerprint sensor is disposed outside the through-hole and close to a lower surface of the middle frame.

11. The electronic equipment according to claim 7, wherein the display panel is a flexible display panel.

12. The electronic equipment according to claim 7, wherein the through-hole overlaps at least partially with the symmetrical axis of the middle frame.

13. The display screen according to claim 1, wherein the flexible packaging layer provides insulation to protect the organic light emitting diode display.

14. The electronic equipment according to claim 7, wherein the flexible packaging layer provides insulation to protect the organic light emitting diode display.

* * * * *